United States Patent [19]
Woeste et al.

[11] Patent Number: 6,060,939
[45] Date of Patent: May 9, 2000

[54] DIGITALLY CONTROLLED DIFFERENTIAL DELAY LINE CIRCUIT AND METHOD OF CONTROLLING SAME

[75] Inventors: Dana Marie Woeste; James David Strom, both of Rochester, Minn.

[73] Assignee: International Business Machines Corporation, Armonk, N.Y.

[21] Appl. No.: 09/176,140

[22] Filed: Oct. 21, 1998

[51] Int. Cl.$^7$ ................................................. H03K 17/62
[52] U.S. Cl. ........................ 327/403; 327/404; 327/284; 327/285; 327/286; 327/287; 327/288; 327/395; 327/535
[58] Field of Search .................................. 327/284, 285, 327/286, 287, 288, 395, 403, 404, 535

[56] References Cited

U.S. PATENT DOCUMENTS

| | | |
|---|---|---|
| 5,491,441 | 2/1996 | Goetschel et al. . |
| 5,666,079 | 9/1997 | Ma .......................................... 327/403 |

OTHER PUBLICATIONS

S. J. Baumgartner et al., "Clock Distribution Method," *IBM Technical Disclosure Bulletin*, 32:10A (1990).

D. R. Cecchi et al., Paper FP 20.2 "A 1GB/S SCI Link in 0.8μm BiCMOS," Session 20, RF/Baseband Processing, 1995 IEEE International Solid–State Circuits Conference.

C. J. Goetschel et al., "Programmable Delay Line," *IBM Technical Disclosure Bulletin*, 37:03 (1994).

R. Gopalan et al., "High–Speed Clock System Design with the ML6500 PACMan Programmable Adaptive Clock Manager," Application Note 21 of Micro Linear Corporation, pp. 1–16 (1993).

D. Woeste et al., Paper FA 8.4 "Digital–Phase Aligner Macro for Clock Tree Compensation with 70ps Jitter," Session 8, Digital Clocks and Latches, 1996 IEEE International Solid–State Circuits Conference.

B. Wüppermann et al., Paper TP 9.1 "A 16–PSK Modulator with Phase Error Correction, " Session 9, Radio Communication Circuits, 1993 IEEE International Solid–State Circuits Conference.

*Primary Examiner*—Timothy P. Callahan
*Assistant Examiner*—Cassandra Cox
*Attorney, Agent, or Firm*—Mark Hollingsworth

[57] ABSTRACT

An apparatus and method for delaying a signal using a variable delay line circuit. A variable delay line circuit includes first and second delay lines, each including a plurality of delay elements. A multiplexer is coupled to respective outputs of the first and second delay lines and selectively couples the output of one of the first or second delay lines to an output of the multiplexer. A control circuit is coupled to the multiplexer and the first and second delay lines, and controls the multiplexer so as to produce a delayed signal at the multiplexer output using one of the first or second delay lines, and changes a delay factor of the other one of the first or second delay lines by varying a resistance and a current of one or more delay elements of the other one of the first or second delay lines. A reference voltage source is coupled to each of the delay elements and provides a reference voltage maintained at a substantially constant amplitude with respect to the power supply to each of the delay elements. The delayed signal may be a differential signal. Each of the delay elements may include one or more adjustable loads or adjustable current sources. An adjustable load may be implemented using P-FETs. In one embodiment, at least one of the delay elements of the first and second delay lines includes a plurality of selectable delay devices, each of which is associated with one of a plurality of selectable delay factors.

30 Claims, 11 Drawing Sheets

DIGITALLY CONTROLLED DIFFERENTIAL DELAY LINE CIRCUIT AND METHOD OF CONTROLLING SAME

FIELD OF THE INVENTION

The present invention relates generally to delay line circuits and, more particularly, to a digitally controlled variable differential delay line circuit exhibiting delay characteristics which are invariant to power supply voltage fluctuations.

BACKGROUND OF THE INVENTION

Delay lines are routinely used in a wide variety of circuits and systems for the primary purpose of delaying the propagation rate of a signal, typically for timing reasons. Programmable delay lines are particularly useful in applications where the amount or duration of signal delay requires repeated adjustment.

In applications in which a high degree of control over the delay duration is required, it is important that the power supply voltage provided to the delay line be controlled so as to minimize voltage swing fluctuations. It is known, for example, that variations in the reference voltage supplied to a delay line can result in unintended alteration in the delay characteristics of the delay line. It is also known, by way of further example, that variations in power supply voltage provided to a delay line can induce unacceptable levels of skew and jitter in the signal propagated through the delay line. Signal discontinuities and perturbations may also be introduced during times in which the delay duration, or delay factor, of the delay line is being adjusted.

There exists a keenly felt need for a variable delay line that overcomes the above-noted deficiencies found in prior art delay line implementations, and one that is insensitive to fluctuations in power supply voltage. There exists a further need for a variable differential delay line that provides superior delay characteristics and control capabilities. The present invention fulfills these and other needs.

SUMMARY OF THE INVENTION

The present invention is directed to an apparatus and method for delaying a signal using a variable delay line circuit. A variable delay line circuit according to the present invention includes a first delay line and a second delay line, each of which includes a number of delay elements. A multiplexer is coupled to respective outputs of the first and second delay lines. The multiplexer selectively couples the output of one of the first or second delay lines to an output of the multiplexer. A reference voltage source is coupled to each of the delay elements and provides a reference voltage maintained at a substantially constant amplitude with respect to the power supply to each of the delay elements.

A control circuit is coupled to the multiplexer and the first and second delay lines. The control circuit controls the multiplexer so as to produce a delayed signal at the multiplexer output using one of the first or second delay lines, and changes a delay factor of the other one of the first or second delay lines by varying a resistance and a current of one or more delay elements of the other one of the first or second delay lines. The delayed signal may be a differential signal.

Each of the delay elements of the first and second delay lines may include an adjustable load and an adjustable current source. Alternatively, at least one of the delay elements may include an adjustable load and an adjustable current source. An adjustable load may be implemented using one or more transistors, such as P-channel field effect transistors. In one embodiment, at least one of the delay elements of the first and second delay lines includes a number of selectable delay devices, each of which is associated with one of a plurality of selectable delay factors.

The control circuit may include a first binary counter and a second binary counter respectively coupled to the first and second delay lines. The control circuit preferably changes the delay factor of the delay lines in accordance with a predetermined step size, such as a step size on the order of picoseconds. The control circuit may change the delay factor within a predetermined range of delay factors, such as a range of binary weighted delays from approximately 20 picoseconds to approximately 1280 picoseconds.

The above summary of the present invention is not intended to describe each embodiment or every implementation of the present invention. Advantages and attainments, together with a more complete understanding of the invention, will become apparent and appreciated by referring to the following detailed description and claims taken in conjunction with the accompanying drawings.

While the invention is amenable to various modifications and alternative forms, specifics thereof have been shown by way of example in the drawings and will be described in detail hereinbelow. It is to be understood, however, that the intention is not to limit the invention to the particular embodiments described. On the contrary, the invention is intended to cover all modifications, equivalents, and alternatives falling within the scope of the invention as defined by the appended claims.

DETAILED DESCRIPTION OF VARIOUS EMBODIMENTS

In the following description of the illustrated embodiments, references are made to the accompanying drawings which form a part hereof, and in which is shown by way of illustration, various embodiments in which the invention may be practiced. It is to be understood that other embodiments may be utilized, and structural and functional changes may be made without departing from the scope of the present invention.

In accordance with the principles of the present invention, a variable delay line circuit employs a reference voltage source that provides a voltage reference at a substantially constant amplitude with respect to the power supply in combination with delay element load/current scaling to provide for delay factors that do not vary significantly with power supply fluctuations. The small signal voltage amplitude or swing of the reference voltage provided to the variable delay line circuit is substantially constant with respect to the power supply, even in the presence of fluctuations in power supply voltage, thereby resulting in the production of delayed signals having substantially reduced skew and jitter.

Figure 1:
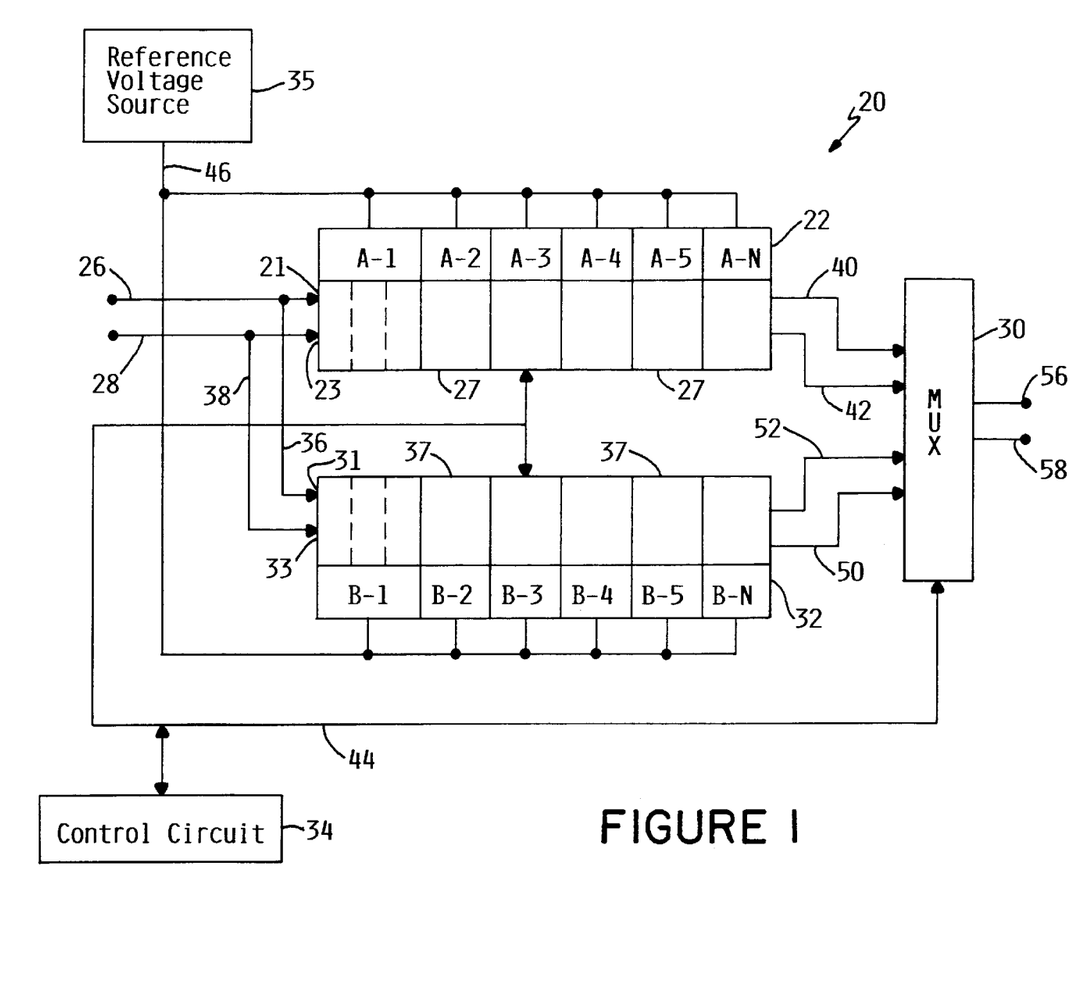
FIG. 1 is a block diagram of a variable delay line circuit employing a pair of delay lines in accordance with an embodiment of the present invention.

Referring to the drawings, and more particularly to FIG. 1, there is illustrated a variable differential delay line circuit 20 in accordance with an embodiment of the present invention. The delay line circuit 20 includes two variable delay lines, 22 and 32, each having differential signal inputs 21, 23 and 31, 33, respectively. A differential input signal received from up-stream circuitry is input to delay lines 22, 32 via conductors 26, 28 and 36, 38, respectively.

Delay lines 22, 32 further include respective differential outputs 40, 42 and 50, 52, each of which is coupled to a multiplexer 30. A control circuit 34 is coupled to each of the delay lines 22, 32 and multiplexer 30 via control lines 44. Control circuit 34 coordinates the operation of the delay line circuitry. A reference voltage source 35 provides a reference voltage having a substantially constant magnitude with respect to the power supply to each of the delay elements 27, 37 of delay lines 22, 32, the details and advantages of which will be described in greater detail hereinbelow. Individual delay elements 27, 37 may be selectively activated for use in delaying a differential input signal or, alternatively, may be bypassed.

The outputs 40, 42 and 50, 52 of respective delay lines 22, 32 are selectively coupled to the outputs 56, 58 of multiplexer 30 in response to control signals received from control circuit 34. In a preferred mode of operation, one of the first or second delay lines 22, 32 is selected for providing delay to a differential input signal applied to conductors 26, 28. The delayed differential signal produced by the selected delay line 22 or 32 is provided at differential outputs 56, 58 of multiplexer 30 and subsequently used by down-stream circuitry.

During the time in which the selected first or second delay line 22 or 32 is used to operate on the differential input signal, the differential outputs of the unused delay line 22 or 32 are decoupled from differential outputs 56, 58 of the multiplexer. The delay factor, or duration of delay, provided by the unused delay line 22 or 32 is adjusted as desired during this time of non-use. A significant advantage realized by adjusting a delay line 22 or 32 during periods of non-use concerns isolating this delay line so that any signal discontinuities resulting from delay factor adjustment is prevented from reaching differential outputs 56, 58 of multiplexer 30.

After the delay factor of one of the two delay lines 22, 32 has been adjusted, control circuit 34 coordinates switching of the differential input signal from the previously in-use delay line 22 or 32 to the newly adjusted delay line 22 or 32. The delay factor of previously in-use delay line 22 or 32, now isolated from the differential outputs 56, 58 of multiplexer 30, may then be adjusted as desired. This process of selectively coupling a differential input signal applied to the delay line circuit 20 between delay lines 22 and 32 is repeated as necessary under the control of control circuit 34.

Each of the delay lines 22, 32 includes a number of delay elements 27, 37. Each delay element 27, 37 is controlled by control circuit 34 in order to vary the amount of delay provided by delay lines 22, 32. In a preferred embodiment, the delay elements are individually and selectively controlled to provide an incremental delay factor in predetermined step sizes, such as 128, 20 picosecond (ps) delay factor steps within a delay range of 20 ps to 1280 ps, for example. In this embodiment, delay lines 22, 32 constitute binary weighted differential delay lines.

As will be discussed later in greater detail, delay elements A-1 and B-1 have a unique structure which may, but not necessarily, be different from that of the other delay elements of delay lines 22, 32, such as delay elements A-2, A-5, B-3, and B-N, for example. More particularly, delay elements A-1 and B-1 of delay lines 22 and 32 may each be controlled to provide for several different delay factors.

Figure 2A:
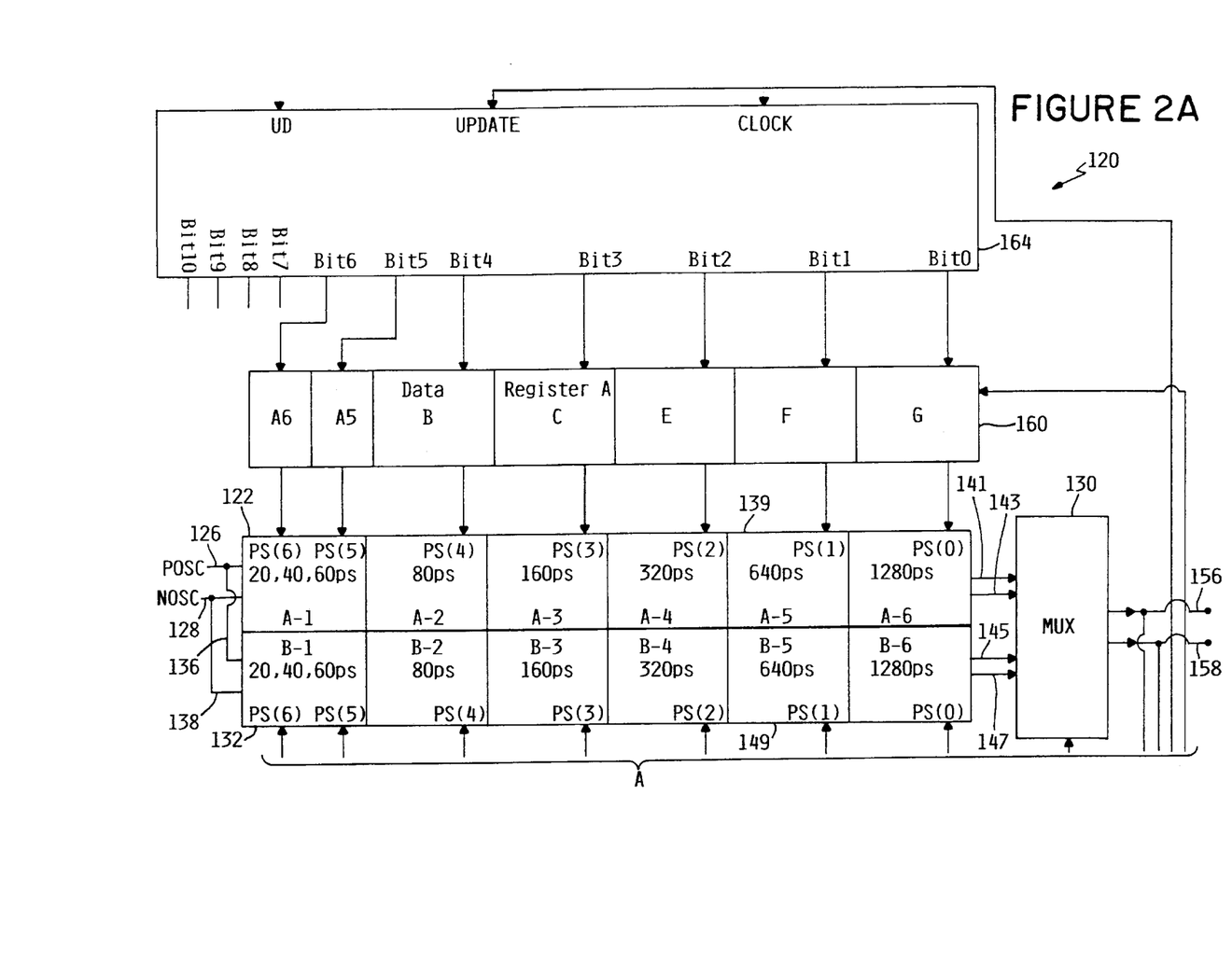
FIG. 2 is a block diagram of a digitally controlled variable delay line circuit employing a pair of binary weighted differential delay lines and digital control logic in accordance with an embodiment of the present invention.
Figure 2B:
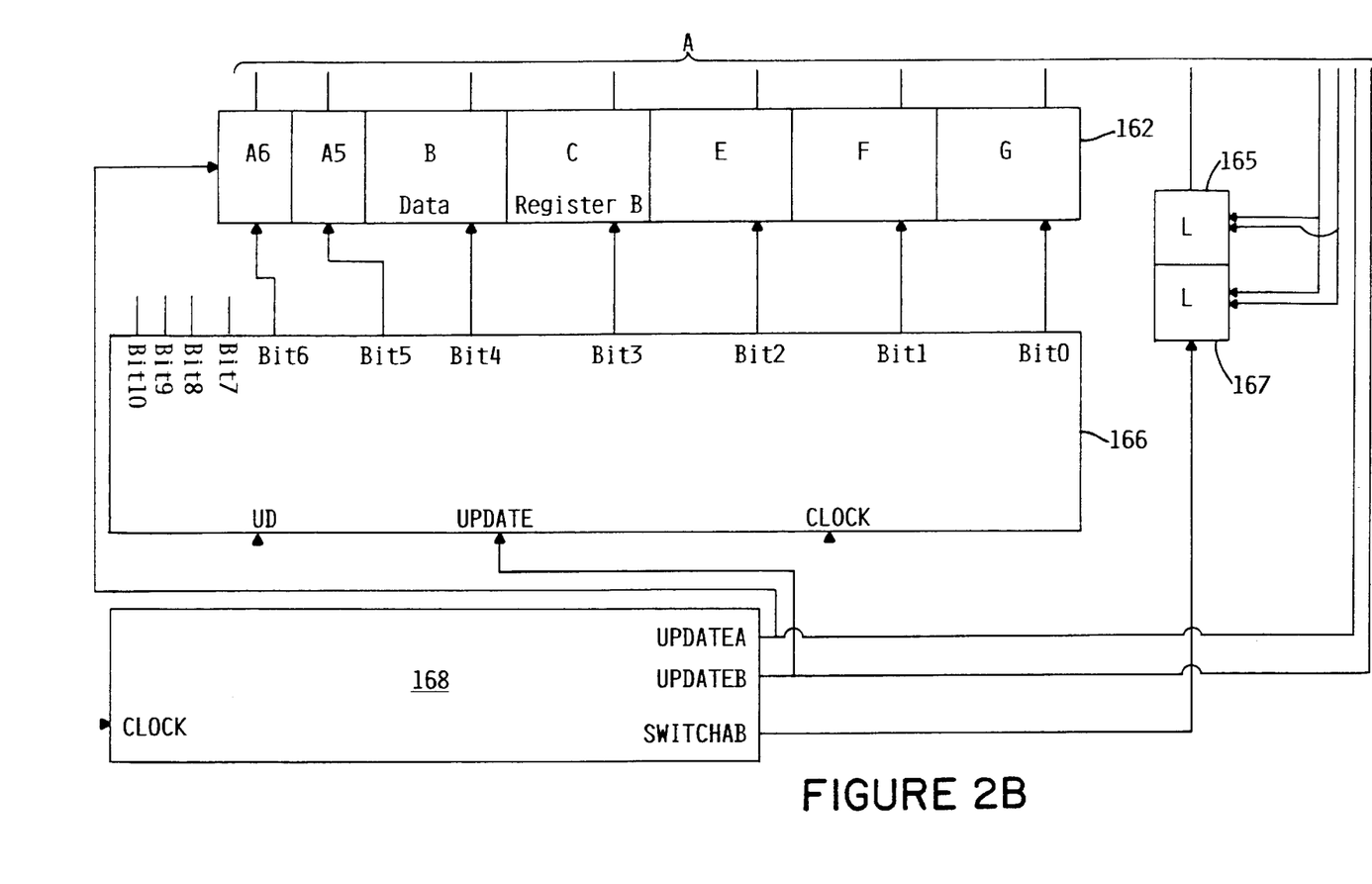

Turning now to FIG. 2, there is illustrated a digitally controlled differential delay line circuit 120 in accordance with another embodiment of the present invention. In accordance with this embodiment, the differential delay line circuit 120 includes two variable delay lines, 122 and 132, each having respective differential signal inputs 126, 128 and 136, 138, for receiving a differential input signal, and respective differential outputs 141, 143 and 145, 147 coupled to a multiplexer 130. An up/down counter 164 is coupled to delay line 122 through buffer circuit 160. An up/down counter 166 is coupled to delay line 132 through buffer circuit 162. Counters 164, 166 control the amount of delay switched into respective delay lines 122, 132.

Figure 3:
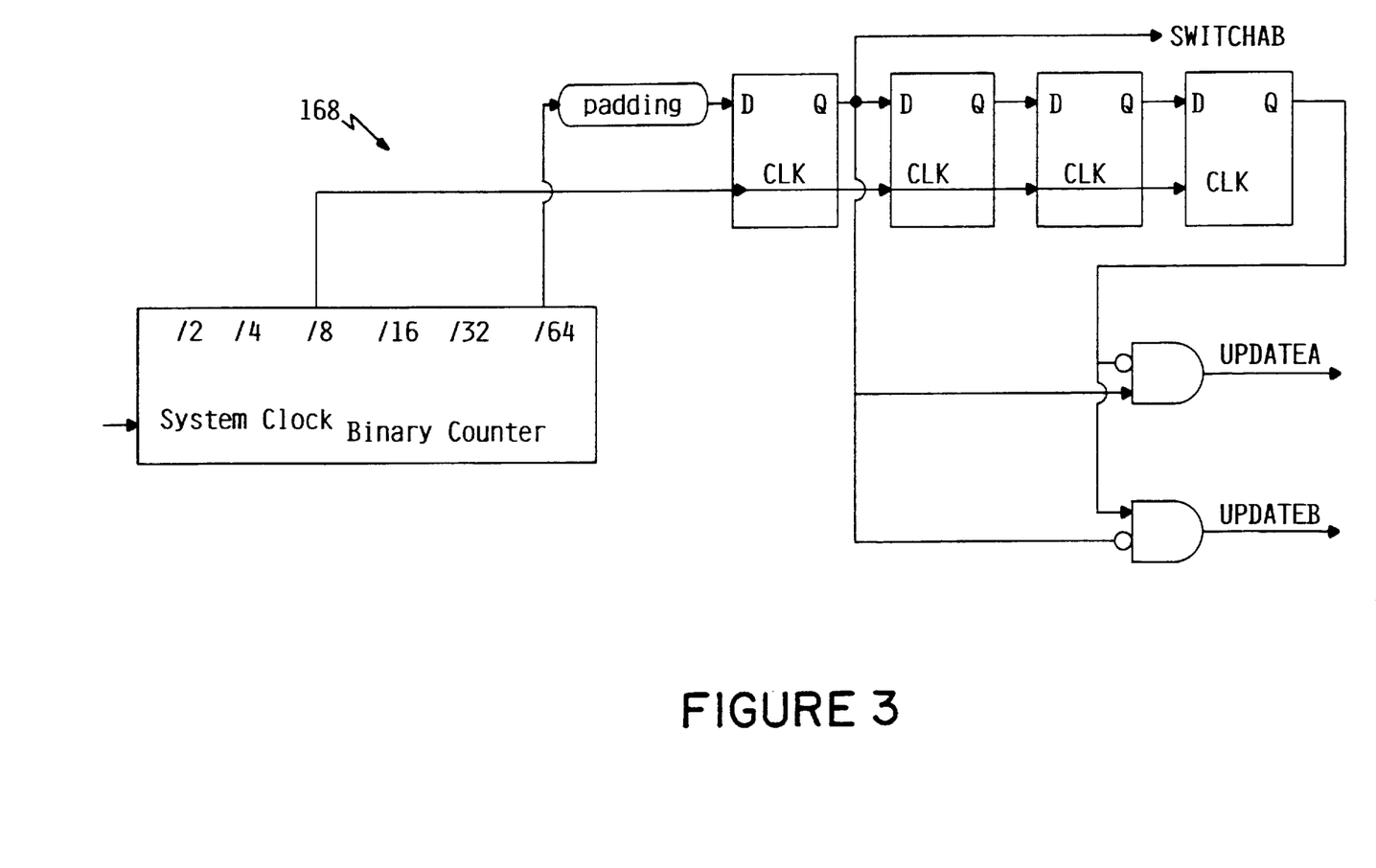
FIG. 3 is a block diagram of the control counter of FIG. 2.
Figure 4:
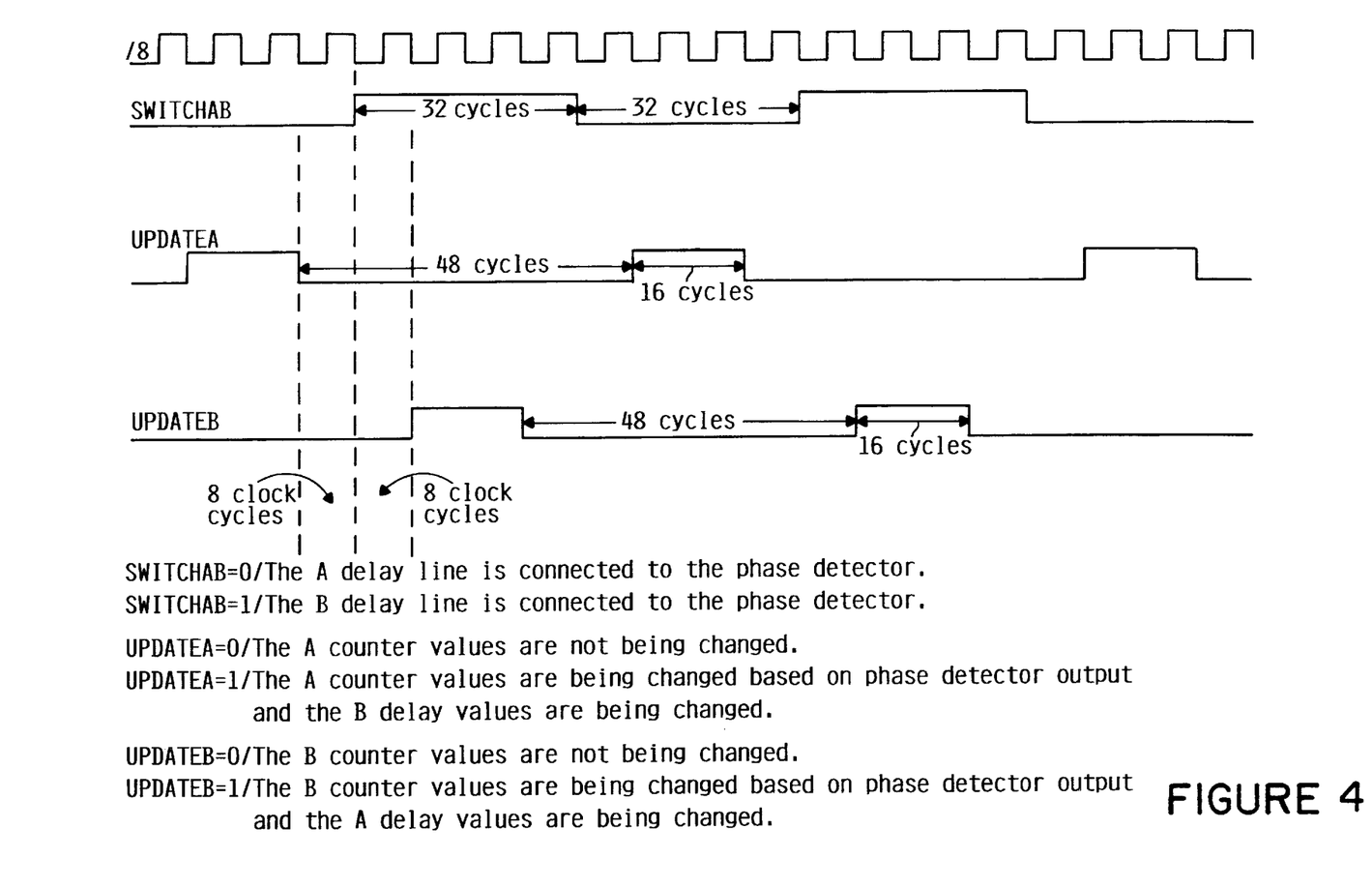
FIG. 4 is a timing diagram associated with the operation of the control counter of FIG. 3.

Counters 164, 166 are respectively coupled to a counter controller 168 which coordinates the operation of counters 164, 166 and, therefore, delay lines 122, 132. In one embodiment, counter controller 168 is implemented as a ping-pong counter which receives a clocking signal from a system clock coupled thereto. A depiction of counter controller 168 and a timing diagram characterizing the operation of counter controller 168 according to this embodiment are provided in FIGS. 3 and 4, respectively.

The outputs 141, 143 and 145, 147 of respective delay lines 122, 132 are selectively coupled to the outputs 156, 158 of the multiplexer 130 in response to signals received from counter controller 168 and signals fed back from outputs 156, 158 of the multiplexer 130 via latches 165, 167. A differential input signal applied to the delay line circuit 120 is selectively coupled between delay lines 122 and 132 in the general manner described previously with respect to FIG. 1. Adjustment to the delay factors of selected delay elements in the unused or inactive delay line 122 or 132 is accomplished in the general manner described previously with respect to FIG. 1.

Figure 5:
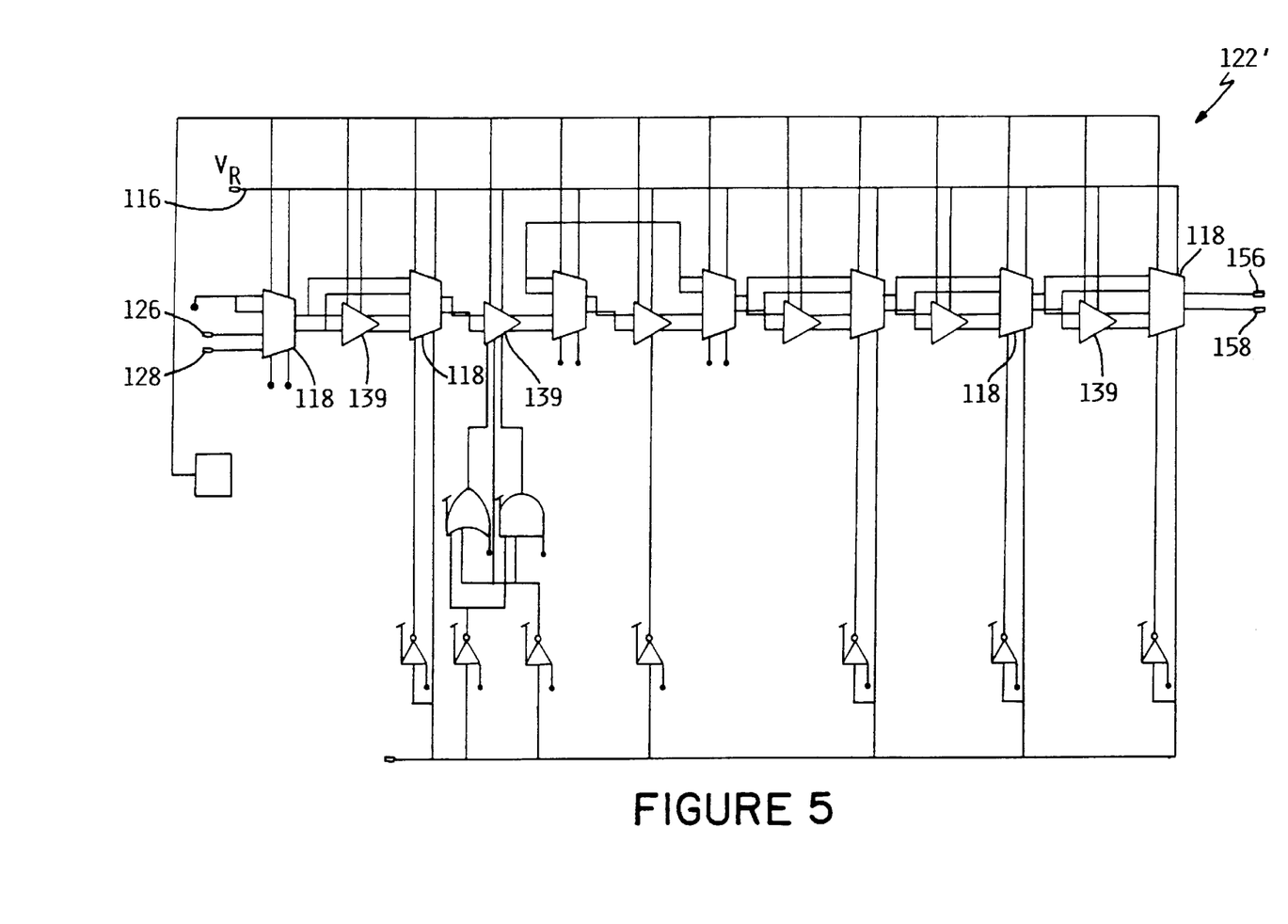
FIG. 5 is a schematic of a single delay line showing individual delay elements and multiplexers in accordance with an embodiment of the present invention.

Delay line circuit 122' depicted in the schematic of FIG. 5 illustrates one embodiment of delay line 122 shown in FIG. 2 in which a multiplexer 118 is coupled between adjacent delay elements 139. A multiplexer 118 is also coupled to differential signal inputs 126, 128 and to differential signal outputs 156, 158 of delay line 122'. Individual delay elements 139 of delay line 122' may be selectively activated for use in delaying a differential input signal or, alternatively, bypassed by appropriately controlling multiplexers 118.

Figure 6:
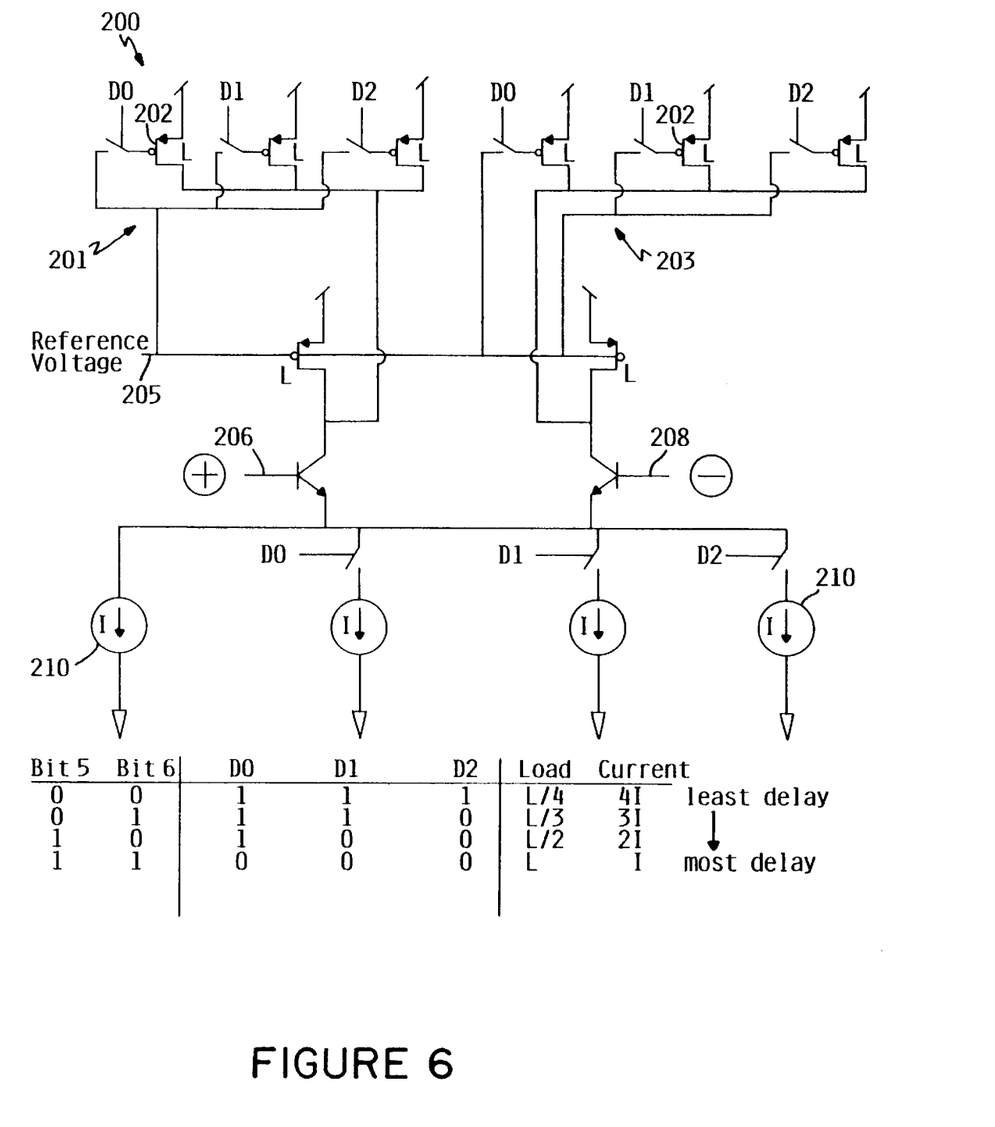
FIG. 6 is a simplified schematic of a delay element which provides four different delay factors in accordance with an embodiment of the present invention.

FIG. 6 is a simplified schematic depiction of delay line element A-1 shown in FIGS. 1 and 2. A more detailed schematic of the embodiment depicted in FIG. 6 is provided in FIG. 7. It is noted that delay line element B-1 has a structure equivalent to that of delay line element A-1. As was discussed previously, delay line elements A-1 and B-1 have unique structures, in that these elements may be controlled to provide a multiplicity of delay factors, such as four different delay factors for example. Other delay elements, such as delay elements A-2, A-4, B-3, and B-5 shown in FIGS. 1 and 2, have a structure similar to that shown in the schematic of FIG. 8. These delay elements may be controlled to provide two different delay factors. It can be seen that the number of different delay factors provided by a delay line element may be varied by varying the number of resistive load elements, as is discussed hereinbelow.

In general, variations in the supply voltage provided to a delay line often result in unintended variations in the delay of the signal propagated through the delay line. It can be appreciated that the duration of the minimum delay factor of a delay line element has an appreciable affect on the magnitude of unintended changes to input signal delay resulting from fluctuations in power supply voltage. The magnitude of unintended delay changes occurring in a delay line element resulting from power supply voltage fluctuation is a function of the percentage of such unintended delay changes relative to the total delay provided by the delay line element. In many applications, it is therefore desirable to keep the total delay of a delay line element as small as possible so that unintended changes in signal delay due to power supply voltage fluctuation is minimized.

Delay elements A-1 and B-1 of delay lines 22, 32 of FIG. 1 or 122, 132 of FIG. 2 provide for a multiplicity of delay factors through controlled activation and deactivation of different combinations of loads and/or current sources. These loads are different for each different delay factor. Current may be scaled up or down so as to maintain the voltage drop across each load at a constant amplitude.

Figure 7:
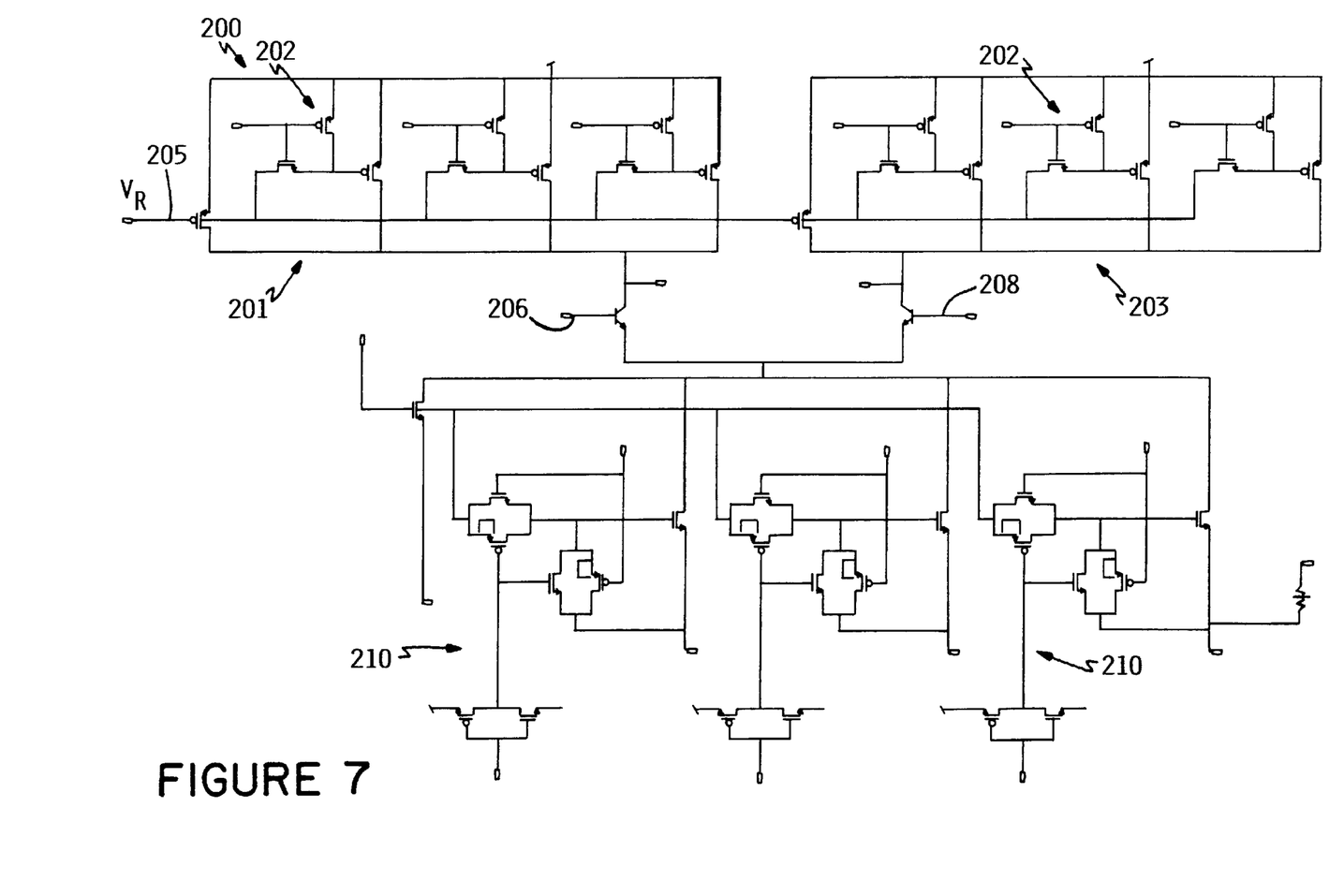
FIG. 7 is a detailed schematic of the circuit of FIG. 6.

With reference to differential delay element circuit 200 shown in FIG. 6, differential delay elements 201, 203 each include a number of resistive elements 202. The resistive elements 202, in accordance with one embodiment, are implemented using P-channel field effect transistors (P-FETS), as is best seen in FIG. 7. It is understood that resistive elements 202, as well as other elements of circuit 200, may be implemented in a technology best suited for a given application.

Each of the resistive elements 202 represents a unit load or unit resistance, L, and each of the current sources 210 represents a unit current, I. The gates of each P-FET resistive element 202 of differential delay elements 201 and 203 is respectively coupled to a reference voltage source which provides a voltage reference 205 of a substantially constant amplitude with respect to the power supply, such as 250 mV for example. A differential input signal is applied to the differential delay element circuit 200 via positive and negative signal inputs 206 and 208, respectively.

A truth table is shown in FIG. 6 which represents the output of the binary counters that control the value of the delay in the delay lines, such as up/down counters 164 and 166 respectively coupled to, and controlling the delay of, variable delay lines 122 and 132 shown in FIG. 2. As is shown in the truth table, the delay factor or duration of delay provided by differential delay elements 201 and 203 may be varied by adjusting the resistance, L, and current, I, in response to digital output signals received from the respective binary counters.

By way of example, when the binary counter output signals, represented by Bits 5 and 6 in FIG. 6, are both 0, the states of nodes D0, D1, and D2 are each 1. In this case, the equivalent resistive loading provided by differential delay element circuit 200 is given by L/4, and the current is given by 4I, which provides for a minimum delay factor. When Bits 5 and 6 are 0 and 1, respectively, the states of nodes D0, D1, and D2 are 1, 1, and 0, respectively. In this case, the equivalent resistive loading provided by differential delay element circuit 200 is given by L/3, and the current is given by 3I.

When Bits 5 and 6 are 1 and 0, respectively, the states of nodes D0, D1, and D2 are 1, 0, and 0, respectively. In this case, the equivalent resistive loading provided by differential delay element circuit 200 is given by L/2, and the current is given by 2I. Finally, when Bits 5 and 6 are both 1, the states of nodes D0, D1, and D2 are each 0. In this case, the equivalent resistive loading provided by differential delay element circuit 200 is given by L, and the current is given by I, which provides for a maximum delay factor.

It is to be understood that counters other than binary weighted counters may be employed to control a delay line implemented in accordance with the principles of the present invention. Gray scale counters, shift registers, and Johnson counters, for example, may be employed, along with appropriate decode logic, to provide appropriately weighted delays.

The differential delay element circuit 200 effectively exploits load and/or current scaling to vary the delay factor provided by the delay element circuit. Moreover, differential delay element circuit 200 provides for a reduced total delay factor associated with each delay element load, thereby providing a delay factor that is substantially insensitive to variations in power supply voltage and temperature conditions.

Figure 8:
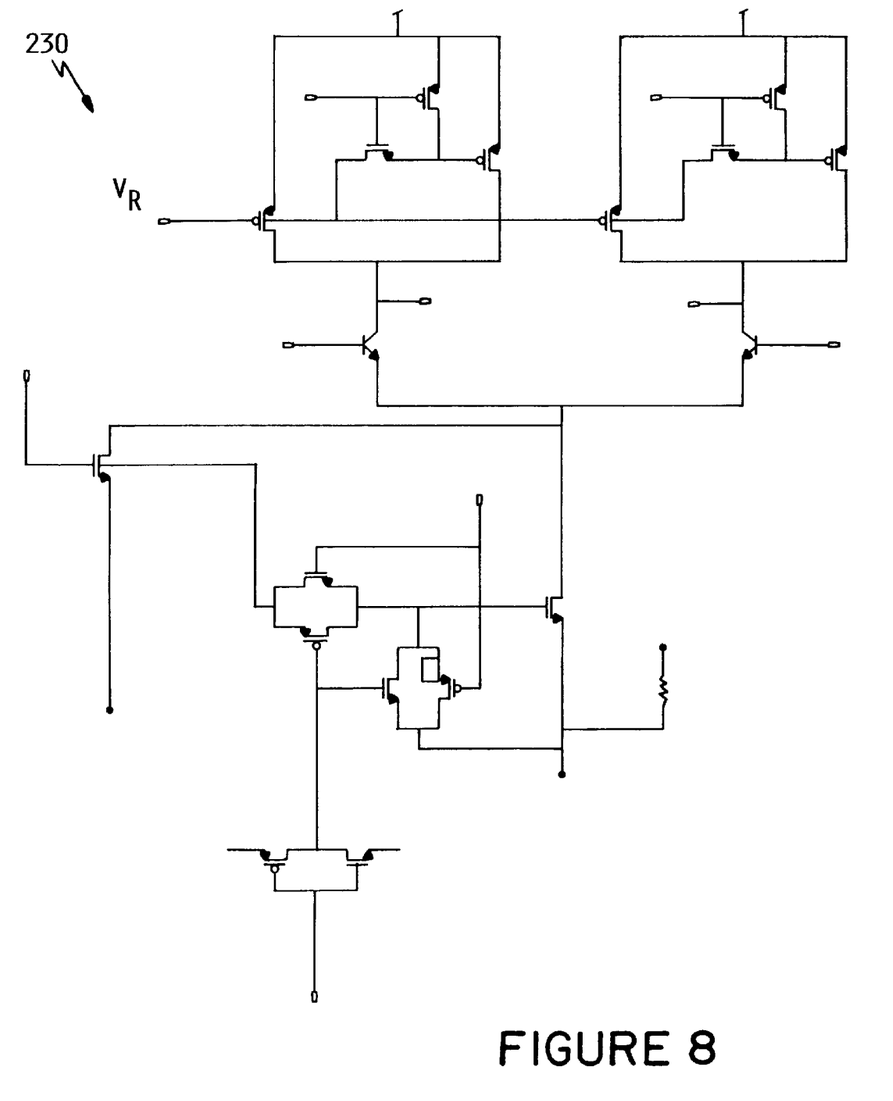
FIG. 8 is a schematic of a delay element which provides two different delay factors in accordance with an embodiment of the present invention.

The differential delay element circuit 230 shown in FIG. 8 operates in a manner substantially similar to that previously described with respect to FIGS. 6 and 7, but provides for only two different delay factors depending on the state of node D0.

As was previously discussed, variations in the supply voltage provided to a delay line often results in unintended variations in the delay of the signal propagated through the delay line. Providing a voltage reference at a constant amplitude with respect to the power supply to each of the delay elements of a delay line, in addition to minimizing the total delay factor of a number of delay devices provided in a delay element as previously discussed, can render the delay line substantially insensitive to power supply voltage fluctuations.

Figure 9:
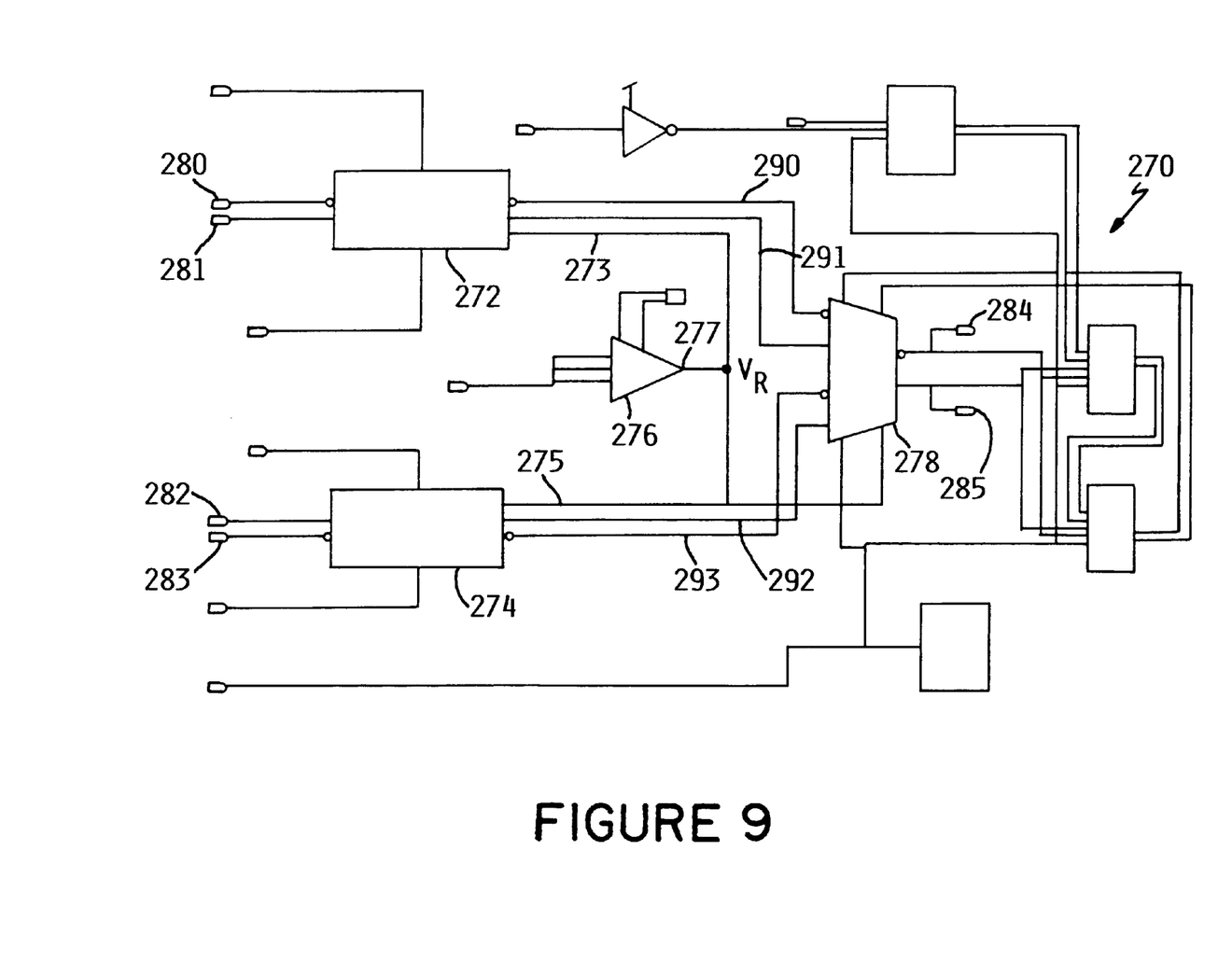
FIG. 9 is a schematic of a pair of delay lines, each of which is supplied a reference voltage signal at a constant amplitude with respect to the power supply by an operational amplifier in accordance with an embodiment of the present invention.

FIG. 9 illustrates in schematic form a circuit 270 including a reference voltage source 276 respectively coupled to two variable delay lines 272, 274 of the type previously described. In this particular embodiment, a differential input signal is applied to delay lines 272 and 274 via differential signal inputs 280, 281 and 282, 283, respectively. Differential signals selectively propagated through delay lines 272, 274 are transmitted to a multiplexer 278 via conductors 290, 291 and 292, 293, which, in turn, selectively couples conductors 290, 291 and 292, 293 to differential signal outputs 284, 285 of multiplexer 278.

It is understood that fluctuations in the amplitude of reference voltage signals supplied to a delay line or delay element typically introduces jitter in the differential input signal propagated through the delay line or delay element, which represents an undesirable variation in signal periodicity. Reference voltage source 276 provides reference voltage signals of a constant amplitude with respect to the power supply to delay lines 272 and 274 via conductors 273 and 275, respectively, resulting in reduced jitter and skew in the differential input signal operated on by the delay lines 272, 274.

Figure 10:
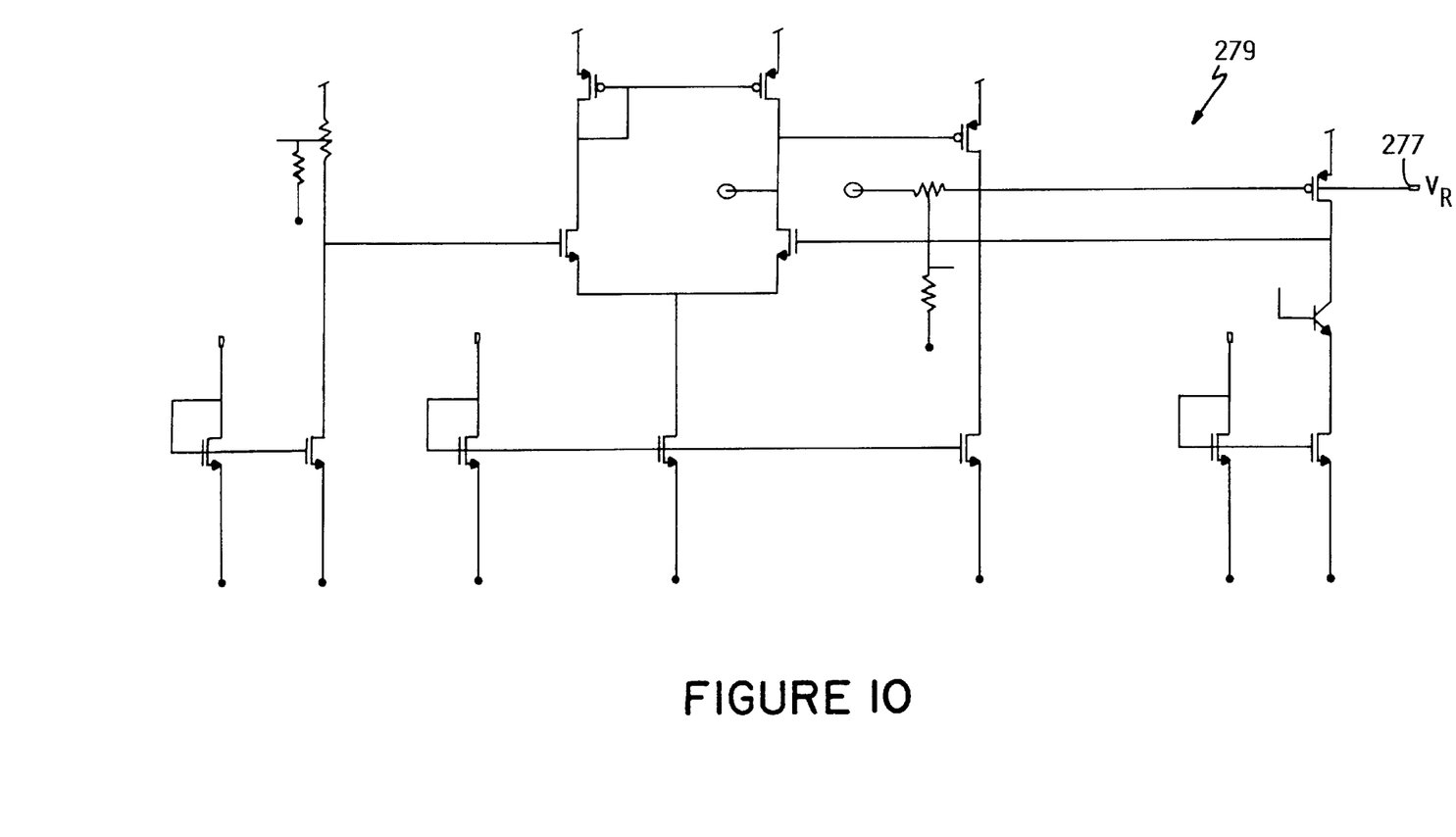
FIG. 10 is a schematic of the operational amplifier of FIG. 9.

In one embodiment of the present invention, reference voltage source 276 includes the operational amplifier (op-amp) circuit 279 shown in FIG. 10. In accordance with this embodiment, op-amp circuit 279 controls the swing amplitude of the reference voltage, $V_R$, produced at output 277 so as to maintain the reference voltage at a substantially constant amplitude with respect to the power supply, such as 250 mV for example. The reference voltage signal of constant amplitude produced at output 277 of op-amp circuit 279 is provided to the gates of the P-FET load elements shown in FIG. 6, for example, as determined by delay line circuit control logic.

The foregoing description of the various embodiments of the invention has been presented for the purposes of illustration and description. It is not intended to be exhaustive or to limit the invention to the precise form disclosed. Many modifications and variations are possible in light of the above teaching. For example, the principles of the present invention may be applied to delay line circuits in which signals other than differential signals are processed, such as a single-ended signal. Various digital aspects of the disclosed embodiments may be implemented using analog techniques. Further, the disclosed circuitry may be implemented using any suitable technology, and is not limited to a CMOS technology. It is intended that the scope of the invention be limited not by this detailed description, but rather by the claims appended hereto.

What is claimed is:

1. A variable delay line circuit, comprising:
   a first delay line including a plurality of delay elements;
   a second delay line including a plurality of delay elements;
   a multiplexer coupled to respective outputs of the first and second delay lines, the multiplexer selectively coupling the output of one of the first or second delay lines to an output of the multiplexer;
   a reference voltage source coupled to each of the delay elements, the reference voltage source providing a reference voltage at a substantially constant amplitude to each of the delay elements; and
   a control circuit coupled to the multiplexer and the first and second delay lines, the control circuit controlling the multiplexer so as to produce a delayed signal at the multiplexer output using one of the first or second delay lines, and changing a delay factor of the other one of the first or second delay lines by varying a resistance and a current of one or more delay elements of the other one of the first or second delay lines.

2. The circuit of claim 1, wherein each of the delay elements of the first and second delay lines comprises an adjustable load and an adjustable current source.

3. The circuit of claim 1, wherein at least one of the delay elements of the first and second delay lines comprises an adjustable load and an adjustable current source.

4. The circuit of claim 3, wherein the adjustable load is implemented using one or more transistors.

5. The circuit of claim 3, wherein the adjustable load is implemented using one or more P-channel field effect transistors.

6. The circuit of claim 1, wherein at least one of the delay elements of the first and second delay lines comprises a plurality of selectable delay devices each associated with one of a plurality of selectable delay factors.

7. The circuit of claim 1, wherein the control circuit comprises a first binary counter and a second binary counter respectively coupled to the first and second delay lines.

8. The circuit of claim 1, wherein the control circuit changes the delay factor of the other one of the first or second delay lines in accordance with a predetermined step size.

9. The circuit of claim 8, wherein the predetermined step size is on the order of picoseconds.

10. The circuit of claim 8, wherein the predetermined step size is approximately 20 picoseconds, and the control circuit changes the delay factor within a range of approximately 20 picoseconds to approximately 1280 picoseconds.

11. The circuit of claim 1, wherein the reference voltage source comprises an operational amplifier that provides the reference voltage of the substantially constant amplitude.

12. The circuit of claim 1, wherein each of the first and second delay lines comprises a differential delay line.

13. A variable delay line circuit, comprising:
   a first delay line including a plurality of delay elements, at least one of the delay elements of the first delay line comprising a plurality of adjustable loads or a plurality of adjustable current sources;
   a second delay line including a plurality of delay elements, at least one of the delay elements of the second delay line comprising a plurality of adjustable loads or a plurality of adjustable current sources;
   a multiplexer coupled to the respective outputs of the first and second delay lines, the multiplexer selectively coupling one of the first or second delay lines to an output of the multiplexer;
   a reference voltage source coupled to each of the delay elements, the reference voltage source providing a reference voltage at a substantially constant amplitude to each of the delay elements; and
   a control circuit coupled to the multiplexer and the first and second delay lines, the control circuit controlling the multiplexer so as to produce a delayed signal at the multiplexer output using one of the first or second delay lines, and changing a delay factor of the other one of the first or second delay lines by adjusting at least one of the adjustable loads and at least one of the adjustable current sources of the other one of the first or second delay lines.

14. The circuit of claim 13, wherein the adjustable loads are implemented using one or more transistors.

15. The circuit of claim 13, wherein the adjustable loads are implemented using one or more P-channel field effect transistors.

16. The circuit of claim 13, wherein each of the adjustable loads and adjustable current sources is associated with a respective delay factor.

17. The circuit of claim 13, wherein the control circuit comprises a first binary counter and a second binary counter respectively coupled to the first and second delay lines.

18. The circuit of claim 13, wherein the control circuit changes the delay factor of the other one of the first or second delay lines in accordance with a predetermined step size.

19. The circuit of claim 18, wherein the predetermined step size is on the order of picoseconds.

20. The circuit of claim 18, wherein the predetermined step size is approximately 20 picoseconds, and the control circuit changes the delay factor within a range of approximately 20 picoseconds to approximately 1280 picoseconds.

21. The circuit of claim 13, wherein the reference voltage source comprises an operational amplifier that provides the reference voltage of the substantially constant amplitude.

22. The circuit of claim 13, wherein each of the first and second delay lines comprises a differential delay line.

23. A method of delaying a signal using a digitally controlled differential delay line circuit comprising first and second delay lines respectively coupled to a multiplexer, each of the first and second delay lines including a plurality of delay elements, the method comprising:

selectively coupling one of the first or second delay lines to an output of the multiplexer;

producing a delayed signal using the selected first or second delay line;

changing, when producing the delayed signal, a delay factor of the other one of the first or second delay lines by varying a resistance and a current of one or more selected delay elements of the other one of the first or second delay lines; and providing, while producing the delayed signal and changing the delay factor, a reference voltage having a substantially constant amplitude to the one or more selected delay elements.

24. The method according to claim 23, wherein the reference voltage is maintained at the substantially constant amplitude irrespective of variations in power supplied to the delay line circuit.

25. The method according to claim 23, wherein a delay of the delayed signal remains substantially constant irrespective of variations in power supplied to the delay line circuit.

26. The method according to claim 23, wherein changing the delay factor of the other one of the first or second delay lines comprises varying a resistance and a current of one or more delay elements of the other one of the first or second delay lines.

27. The method according to claim 23, wherein the delayed signal is a differential signal.

28. The method according to claim 23, wherein the delay factor represents a time delay of a preestablished duration.

29. The method according to claim 23, further comprising selecting one of a plurality of binary-weighted delay factors.

30. The method according to claim 29, wherein each of the binary-weighted delay factors represents a time delay step change of a predetermined duration.

* * * * *